(12) United States Patent
Pai

(10) Patent No.: US 10,147,615 B2
(45) Date of Patent: Dec. 4, 2018

(54) FABRICATION METHOD OF PACKAGE STRUCTURE

(71) Applicant: Siliconware Precision Industries Co., Ltd., Taichung (TW)

(72) Inventor: Yu-Cheng Pai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/440,390

(22) Filed: Feb. 23, 2017

(65) Prior Publication Data

US 2017/0229319 A1    Aug. 10, 2017

Related U.S. Application Data

(62) Division of application No. 14/833,103, filed on Aug. 23, 2015.

(30) Foreign Application Priority Data

Oct. 22, 2014 (TW) .............................. 103136417 A

(51) Int. Cl.
*H01L 21/48* (2006.01)
*H01L 23/498* (2006.01)
(Continued)

(52) U.S. Cl.
CPC ........ *H01L 21/4853* (2013.01); *H01L 21/486* (2013.01); *H01L 21/4846* (2013.01); *H01L 21/56* (2013.01); *H01L 21/6835* (2013.01); *H01L 23/3128* (2013.01); *H01L 23/3178* (2013.01); *H01L 23/49811* (2013.01);
(Continued)

(58) Field of Classification Search
CPC ... H01L 21/4853; H01L 21/486; H01L 21/56; H01L 23/49827; H01L 23/49894; H01L 21/4846; H01L 21/6835; H01L 24/11; H01L 24/17; H01L 23/3178; H01L 23/49811; H01L 23/14
See application file for complete search history.

(56) References Cited

U.S. PATENT DOCUMENTS 7,498,668 B2   3/2009 Kawabata et al.
7,851,269 B2  12/2010 Muthukumar et al.
(Continued)

*Primary Examiner* — Joseph C Nicely
(74) *Attorney, Agent, or Firm* — Mintz Levin Cohn Ferris Glovsky and Popeo, P.C.; Peter F. Corless; Steven M. Jensen

(57) ABSTRACT

A method for fabricating a package structure is provided, which includes the steps of: forming a first insulating layer on a carrier; forming a dielectric body on the first insulating layer, wherein the dielectric body has a first surface formed on the first insulating layer and a second surface opposite to the first surface, and a circuit layer and a plurality of conductive posts formed on the circuit layer are embedded in the dielectric body; forming a second insulating layer on the second surface of the dielectric body, wherein the glass transition temperature of the first insulating layer and/or the second insulating layer is greater than 250° C.; and removing the carrier. Since the glass transition temperature of the first or second insulating layer is greater than that of the dielectric body, the package structure has a preferred strength to avoid warping, thereby dispensing with a support member.

8 Claims, 5 Drawing Sheets

(51) Int. Cl.
    *H01L 21/56*     (2006.01)
    *H01L 21/683*     (2006.01)
    *H01L 23/31*     (2006.01)
    *H01L 23/00*     (2006.01)

(52) U.S. Cl.
    CPC .. *H01L 23/49816* (2013.01); *H01L 23/49827* (2013.01); *H01L 23/49894* (2013.01); *H01L 24/11* (2013.01); *H01L 24/17* (2013.01); *H01L 2221/68345* (2013.01); *H01L 2221/68359* (2013.01); *H01L 2224/1403* (2013.01); *H01L 2224/16237* (2013.01)

(56) References Cited

U.S. PATENT DOCUMENTS

| | | | |
|---|---|---|---|
| 8,127,979 B1 | 3/2012 | Wu et al. | |
| 2004/0262777 A1 | 12/2004 | Kim et al. | |
| 2006/0043570 A1 | 3/2006 | Muramatsu et al. | |
| 2006/0160346 A1 | 7/2006 | Hori | |
| 2007/0037377 A1 | 2/2007 | Richardson et al. | |
| 2007/0096291 A1 | 5/2007 | Kawabata et al. | |
| 2007/0268675 A1 | 11/2007 | Chinda et al. | |
| 2009/0001599 A1 | 1/2009 | Foong et al. | |
| 2011/0024172 A1 | 2/2011 | Maruyama et al. | |
| 2011/0049710 A1* | 3/2011 | Kao | H01L 23/49838 257/738 |
| 2011/0215464 A1 | 9/2011 | Guzek et al. | |
| 2011/0308849 A1* | 12/2011 | Kondo | H01L 23/49822 174/260 |
| 2012/0326300 A1* | 12/2012 | Feng | H01L 23/3114 257/737 |
| 2013/0008706 A1 | 1/2013 | Tseng et al. | |
| 2013/0009306 A1 | 1/2013 | Tseng et al. | |
| 2014/0117538 A1 | 5/2014 | Chen et al. | |
| 2014/0117552 A1 | 5/2014 | Qian et al. | |
| 2014/0299999 A1* | 10/2014 | Hu | H01L 24/96 257/774 |
| 2015/0219990 A1* | 8/2015 | Malik | C08G 73/1067 428/473.5 |
| 2015/0228506 A1 | 8/2015 | Tan et al. | |
| 2015/0228556 A1 | 8/2015 | Lee et al. | |
| 2015/0279771 A1 | 10/2015 | Huang | |
| 2015/0303138 A1 | 10/2015 | Tsai et al. | |
| 2015/0303148 A1 | 10/2015 | Kim et al. | |
| 2015/0348929 A1 | 12/2015 | Hsiao et al. | |
| 2015/0359096 A1* | 12/2015 | Hsu | H05K 3/4697 361/761 |
| 2015/0361264 A1 | 12/2015 | Simone et al. | |
| 2016/0056055 A1* | 2/2016 | Ko | H01L 23/562 438/107 |
| 2016/0056057 A1* | 2/2016 | Yu | H01L 21/4846 257/774 |
| 2016/0056100 A1* | 2/2016 | Yeh | H01L 24/81 257/676 |
| 2016/0071780 A1 | 3/2016 | Chiu et al. | |
| 2016/0073516 A1* | 3/2016 | Chou | H01L 23/49827 174/251 |
| 2016/0086879 A1 | 3/2016 | Sun et al. | |
| 2016/0093546 A1 | 3/2016 | Pai et al. | |
| 2016/0155716 A1 | 6/2016 | Sun et al. | |
| 2016/0163621 A1 | 6/2016 | Chiu et al. | |
| 2016/0307874 A1* | 10/2016 | Oggioni | H01L 24/16 |
| 2017/0110383 A1* | 4/2017 | Huang | H01L 23/3135 |
| 2017/0148723 A1* | 5/2017 | Tanikella | H01L 23/49894 |
| 2017/0309537 A1* | 10/2017 | Chiu | H01L 23/49861 |

\* cited by examiner

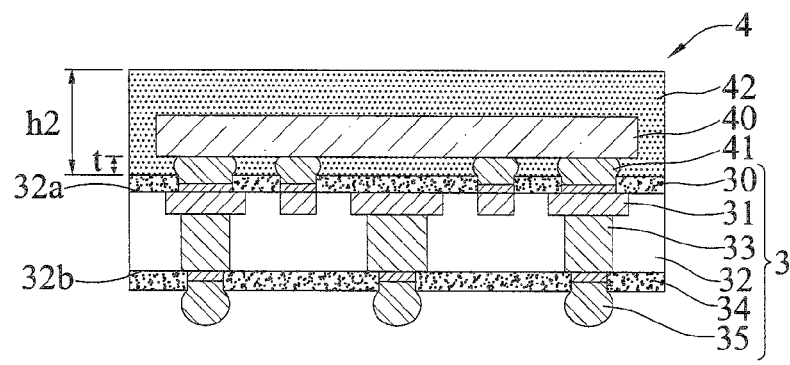
FIG.2E
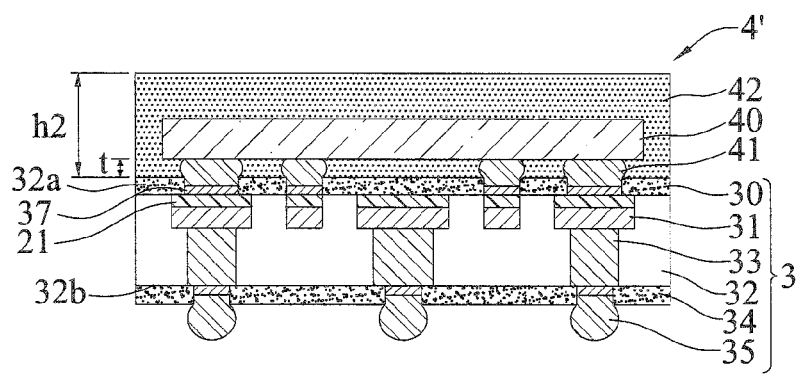
FIG.2E'
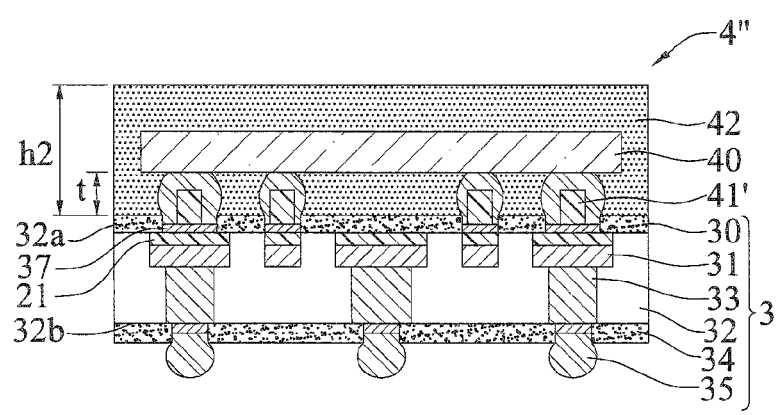
FIG.2E"

FABRICATION METHOD OF PACKAGE STRUCTURE

CROSS-REFERENCE TO RELATED APPLICATION(S)

This application is a divisional of copending application U.S. Ser. No. 14/833,103, filed on Aug. 23, 2015, which claims under 35 U.S.C. § 119(a) the benefit of Taiwanese Patent Application No. 103136417, filed Oct. 22, 2014, the entire contents of which are incorporated herein by reference.

BACKGROUND OF THE INVENTION

1. Field of the Invention

The present invention relates to package structures and fabrication methods thereof, and more particularly, to a carrier-free package structure and a fabrication method thereof.

2. Description of Related Art

Along with the rapid development of electronic industries, many high-end electronic products are developed toward the trend of high integration. Accordingly, various chip packaging technologies are developed and chip packaging sizes are continuously reduced to meet the miniaturization requirement of semiconductor packages.

FIGS. 1A to 1F are schematic cross-sectional views showing a method for fabricating a package structure according to the prior art.

Referring to FIG. 1A, a circuit layer 11 is formed on a carrier 10.

Then, referring to FIG. 1B, a plurality of conductive posts 13 are formed on a portion of the circuit layer 11.

Thereafter, referring to FIG. 1C, a dielectric body 12 is formed on the carrier 10 to embed the conductive posts 13 and the circuit layer 11 therein. The dielectric body 12 has a first surface 12a formed on the carrier 10 and a second surface 12b opposite to the first surface 12a.

Referring to FIG. 1D, the carrier 10 is partially removed. As such, the remaining portion of the carrier 10 forms a carrier 10'. Further, a semiconductor element 40 is disposed on the first surface 12a of the dielectric body 12.

Referring to FIGS. 1E and 1F, a mold 90 is disposed on the carrier 10' and thus a receiving space 900 is formed between the first surface 12a of the dielectric body 12 and the mold 90. Then, an encapsulant 42 is injected into the receiving space 900. As such, a package structure 1 is formed, as shown in FIG. 1F.

In the above-described method, the carrier 10' supports the overall structure so as to prevent warping of the package structure during high temperature processes.

However, limited by current processing methods, the carrier 10', such as a steel board, has a minimum thickness of 200 μm. As such, even if the mold cavity of the mold 90 is flush with the carrier 10', as shown in FIG. 1E', the thickness h1 of the encapsulant 42 is still limited by the minimum thickness of the carrier 10' of 200 μm. Therefore, the thickness of the overall package structure is difficult to be reduced and consequently the package structure cannot meet the miniaturization requirement of electronic products.

Therefore, there is a need to provide a package structure and a fabrication method thereof so as to overcome the above-described drawbacks.

SUMMARY OF THE INVENTION

In view of the above-described drawbacks, the present invention provides a method for fabricating a package structure, which comprises the steps of: forming a first insulating layer on a carrier; forming a dielectric body on the first insulating layer, wherein the dielectric body has a first surface coupled to the first insulating layer and a second surface opposite to the first surface, and a circuit layer and a plurality of conductive posts formed on the circuit layer are embedded in the dielectric body; forming a second insulating layer on the second surface of the dielectric body, wherein the glass transition temperature of the first insulating layer and/or the second insulating layer is greater than 250° C.; and removing the carrier.

The present invention further provides a package structure, which comprises: a dielectric body having opposite first and second surfaces; a circuit layer embedded in the dielectric body; a plurality of conductive posts formed on the circuit layer and embedded in the dielectric body; a first insulating layer formed on the first surface of the dielectric body; and a second insulating layer formed on the second surface of the dielectric body, wherein the glass transition temperature of the first insulating layer and/or the second insulating layer is greater than 250° C.

In the above-described structure and method, the conductive posts can be exposed from the second surface of the dielectric body. Further, the first insulating layer can have a plurality of first openings for exposing the circuit layer, and the second insulating layer can have a plurality of second openings for exposing the conductive posts. Furthermore, a plurality of conductive bumps can be formed on the circuit layer exposed from the first openings of the first insulating layer. In an embodiment, the conductive bumps have a height of 50 μm.

The above-described structure and method can further comprise disposing a semiconductor element on the first insulating layer, wherein the semiconductor element is electrically connected to the circuit layer. Further, an encapsulant can be formed on the first insulating layer to encapsulate the semiconductor element.

In the above-described structure and method, the encapsulant can have a thickness between 20 and 180 μm.

In the above-described structure and method, the thickness of the first insulating layer or the second insulating layer can be between 1 and 20 μm.

In the above-described structure and method, the glass transition temperature of the first insulating layer and/or the second insulating layer can be greater than 400° C.

In the above-described structure and method, the first insulating layer and/or the second insulating layer can be made of polyimide, (PI), polyamide-imide (PAI) or polybenzimidazole (PBI).

Since the first insulating layer and/or the second insulating layer have a high glass transition temperature, the package structure has a preferred strength to avoid warping. Therefore, the final package structure does not need the carrier for support.

Further, the first insulating layer and the second insulating layer can be used for circuit protection without increasing the thickness of the overall package structure. As such, after the semiconductor element is disposed on the first insulating layer, the encapsulant encapsulating the semiconductor element has a thickness less than 200 μm. Therefore, the package structure has a reduced thickness and is applicable in thin electronic products.

BRIEF DESCRIPTION OF DRAWINGS

FIGS. 2A to 2E" are schematic cross-sectional views showing a method for fabricating a package structure according to the present invention, wherein FIG. 2A' shows another embodiment of FIG. 2A, FIG. 2B' shows another embodiment of FIG. 2B, FIG. 2D' shows another embodiment of FIG. 2D, and FIGS. 2E' and 2E" show other embodiments of FIG. 2E.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2E are schematic cross-sectional views showing a method for fabricating a package structure according to the present invention.

Figure 1A:
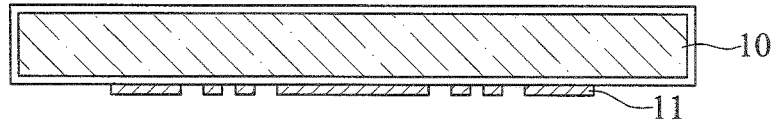
FIGS. 1A to 1F are schematic cross-sectional views showing a method for fabricating a package structure according to the prior art, wherein FIG. 1E' shows another embodiment of FIG. 1E.
Figure 1B:
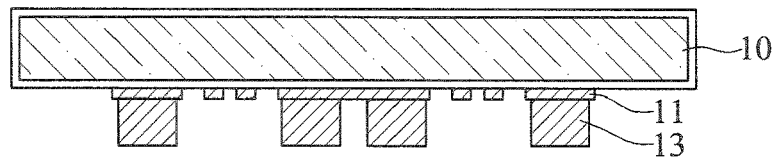
Figure 1C:
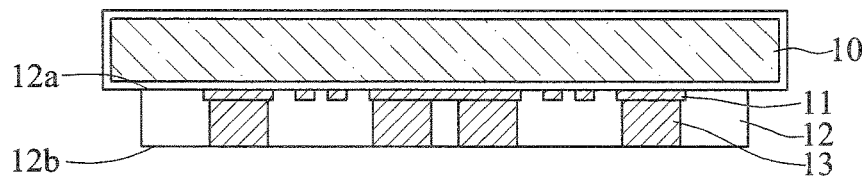
Figure 1D:
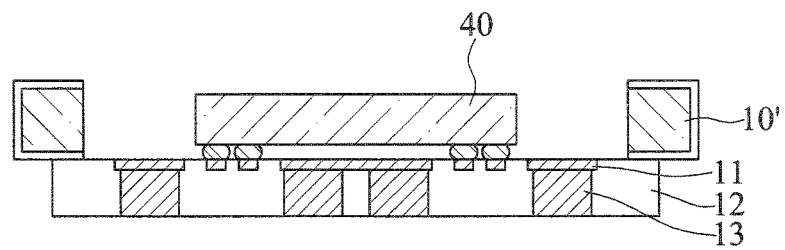
Figure 1E:
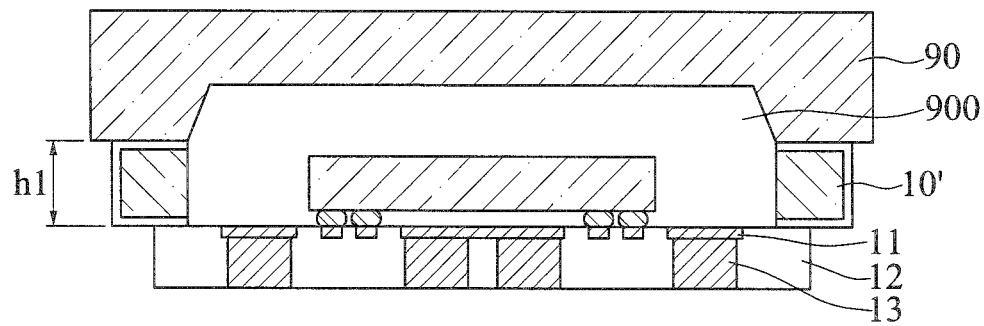
Figure 1E:
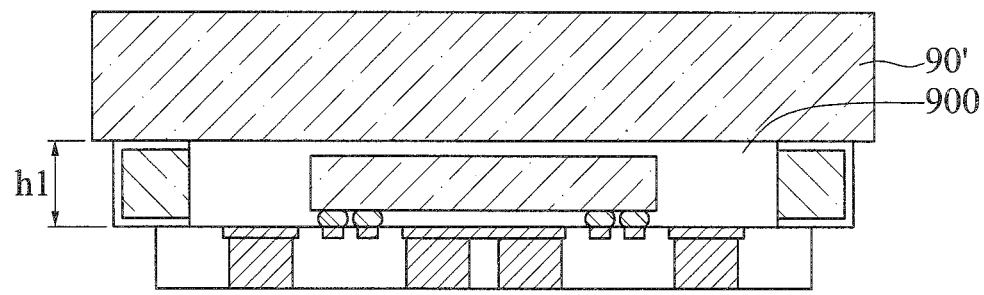
Figure 1F:
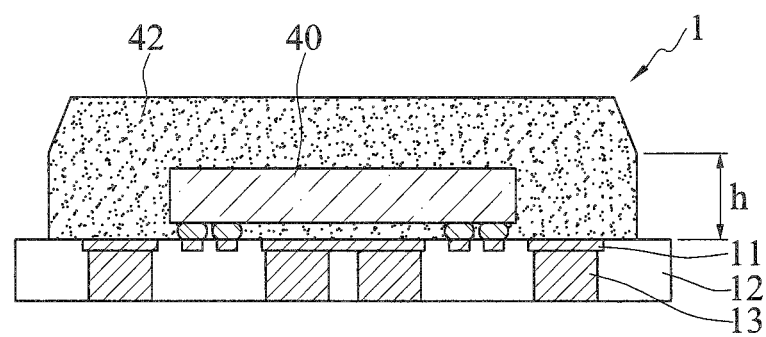
Figure 2A:
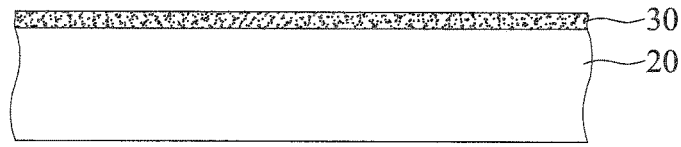
Figure 2A:
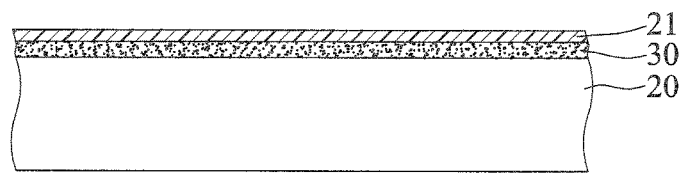

Referring to FIG. 2A, a first insulating layer 30 is formed on a carrier 20.

In the present embodiment, the carrier 20 is, for example, a steel board, a silicon board or a glass board and has a metal layer, such as copper, thereon.

The glass transition temperature of the first insulating layer 30 is greater than 250° C., preferably greater than 400° C.

Further, the first insulating layer 30 is made of polyimide (PI), polyamide-imide (PAI) or polybenzimidazole (PBI).

In an embodiment, referring to FIG. 2A', a seed layer 21 is further formed on the first insulating layer 30 for a subsequent electroplating process. The seed layer 21 can be made of any metal material that can be patterned through etching.

Figure 2B:
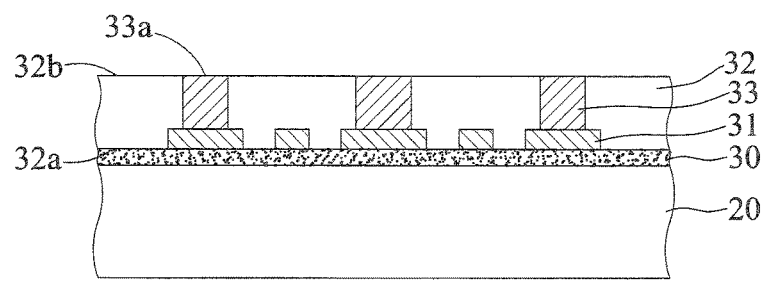
Figure 2B:
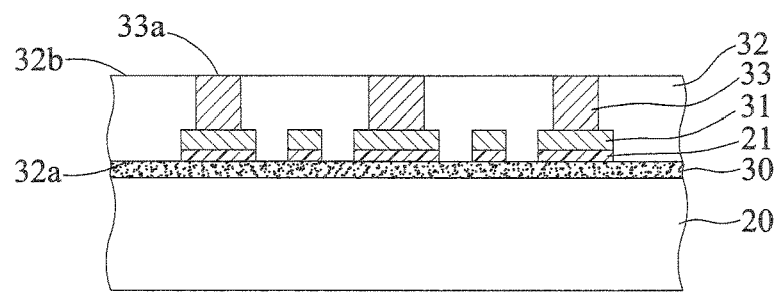

Referring to FIG. 2B, a dielectric body 32 is formed on the first insulating layer 30. The dielectric body 32 has a first surface 32a coupled to the first insulating layer 30 and a second surface 32b opposite to the first surface 32a. A circuit layer 31 and a plurality of conductive posts 33 formed on the circuit layer 31 are embedded in the dielectric body 32. The conductive posts 33 have end surfaces 33a exposed from the second surface 32b of the dielectric body 32.

In the present embodiment, the circuit layer 31 is formed on the first insulating layer 30 and the conductive posts 33 are formed on a portion of the circuit layer 31. Then, a dielectric material is formed on the first insulating layer 30 to form the dielectric body 32 encapsulating the circuit layer 31 and the conductive posts 33. But it should be noted that there is no special limitation on the order of formation of the dielectric body 32, the circuit layer 31 and the conductive posts 33.

The dielectric body 32 can be made of, but not limited to, a molding compound material, a prepreg material or a photo-dielectric material. In another embodiment, the dielectric body 32 is made of the same material as the first insulating layer 30.

The conductive posts 33 can have a circular cylindrical shape, an elliptical cylindrical shape or a polygonal cylindrical shape.

In another embodiment, referring to FIG. 2B', which is continued from FIG. 2A', the circuit layer 31 is formed on the seed layer 21.

Figure 2C:
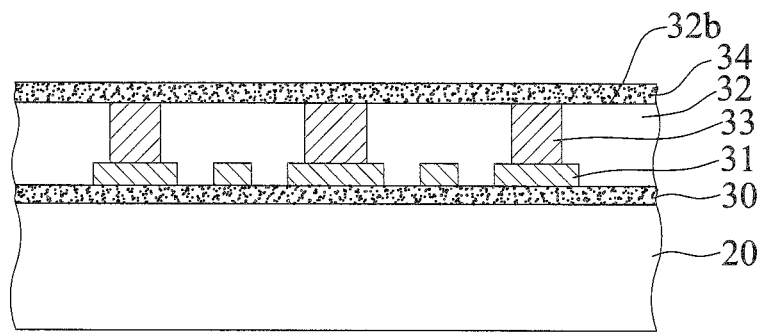

Referring to FIG. 2C, a second insulating layer 34 is formed on the second surface 32b of the dielectric body 32.

In the present embodiment, the glass transition temperature of the second insulating layer 34 is greater than 250° C., preferably greater than 400° C.

The second insulating layer 34 can be made of polyimide (PI), polyamide-imide (PAI) or polybenzimidazole (PBI).

Figure 2D:
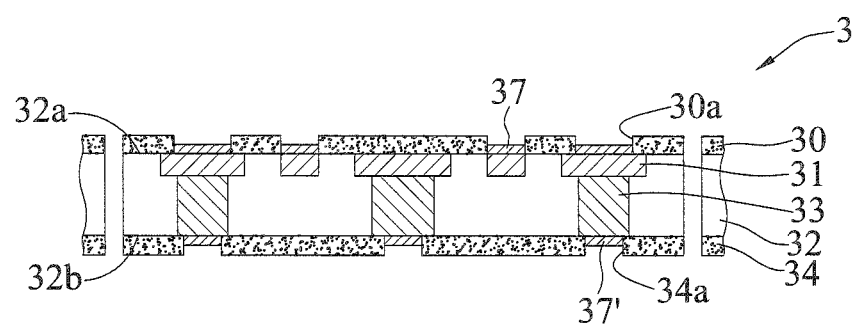
Figure 2D:
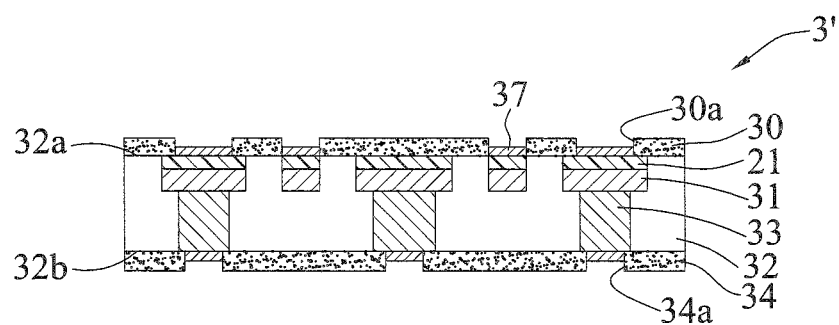

Referring to FIG. 2D, which is continued from FIG. 2C, the carrier 20 is removed, thereby exposing the first insulating layer 30. Then, a plurality of first openings 30a are formed in the first insulating layer 30, for exposing the circuit layer 31. A plurality of second openings 34a are formed in the second insulating layer 34, for exposing the conductive posts 33. Thereafter, a singulation process is performed. As such, a package structure 3 is formed.

In the present embodiment, a surface processing layer 37 is formed on the circuit layer 31 and a surface processing layer 37' is formed on the conductive posts 33. The surface processing layer 37, 37' can be made of an alloy of nickel, palladium and gold or an organic solderability preservative (OSP).

In another embodiment, referring to FIG. 2D', which is continued from FIG. 2B', the surface processing layer 37 is formed on the seed layer 21. As such, a package structure 3' is formed.

According to the present invention, since the glass transition temperature of the first insulating layer 30 and/or the second insulating layer 34 is greater than 250° C., the first insulating layer 30 and/or the second insulating layer 34 cause the package structure 3 to have a preferred strength to avoid cracking or warping during high temperature processes. Therefore, the carrier 20 is removed and not used for support in subsequent processes.

Thereafter, referring to FIG. 2E, a semiconductor element 40 is disposed on the first insulating layer 30 and electrically connected to the circuit layer 31. Then, an encapsulant 42 is formed on the first insulating layer 30 to encapsulate the semiconductor element 40. In particular, a plurality of conductive bumps 41, made of such as a solder material, are formed on the circuit layer 31 exposed from the first openings 30a of the first insulating layer 30, and the semiconductor element 40 is electrically connected to the circuit layer 31 through the conductive bumps 41. As such, a package structure 4 is formed.

In the present embodiment, the glass transition temperature of the encapsulant 42 is less than the glass transition temperature of the first insulating layer 30 or the second insulating layer 34.

FIG. 2E' is continued from FIG. 2D'. Referring to FIG. 2E', a package structure 4' is formed.

In an embodiment, referring to FIG. 2E", each of the conductive bumps 41' has copper pillar and a solder material formed on the copper pillar, and a package structure 4" is formed.

Further, the thickness h2 of the encapsulant 42 is between 20 and 180 μm, and the height t of the conductive bumps 41 is 50 μm.

In the package structure 4, 4', 4", since the glass transition temperature of the first insulating layer 30 and/or the second insulating layer 34 is greater than 250° C., the carrier 20 can be removed. Therefore, the thickness h2 of the encapsulant 42 is between 20 and 180 μm.

The present invention provides a package structure 3, 3', 4, 4', 4", which has: a dielectric body 32 having opposite first and second surfaces 32a, 32b; a circuit layer 31 embedded in the dielectric body 32; a plurality of conductive posts 33 formed on the circuit layer 31 and embedded in the dielectric body 32; a first insulating layer 30 formed on the first surface 32a of the dielectric body 32; and a second insulating layer 34 formed on the second surface 32b of the dielectric body 32, wherein the glass transition temperature of the first insulating layer 30 and/or the second insulating layer 34 is greater than 250° C.

The thickness of the first insulating layer 30 and/or the second insulating layer 34 can be between 1 and 20 μm.

In an embodiment, the conductive posts 33 are exposed from the second surface 32b of the dielectric body 32. The first insulating layer 30 can have a plurality of first openings 30a for exposing the circuit layer 31, and the second insulating layer 34 can have a plurality of second openings 34a for exposing the conductive posts 33. The package structure can further have a plurality of conductive bumps 41, 41' formed on the circuit layer 31 exposed from the first openings 30a of the first insulating layer 30. The height t of the conductive bumps 41, 41' can be 50 μm.

In an embodiment, the package structure further has a semiconductor element 40 disposed on the first insulating layer 30 and electrically connected to the circuit layer 31, and an encapsulant 42 formed on the first insulating layer 30 for encapsulating the semiconductor element 40. The thickness h2 of the encapsulant is between 20 and 180 μM.

In an embodiment, the glass transition temperature of the first insulating layer 30 and/or the second insulating layer 34 is greater than 400° C.

In an embodiment, the first insulating layer 30 and/or the second insulating layer 34 are made of polyimide, (PI), polyamide-imide (PAI) or polybenzimidazole (PBI).

According to the present invention, since the first insulating layer and/or the second insulating layer have a high glass transition temperature, the package structure has a preferred strength to avoid warping. Therefore, the final package structure does not need the carrier for support.

Further, during a high-temperature and long-time reflow process, for example, an infrared (IR) reflow process, the first insulating layer and/or the second insulating layer are not easy to soften or displace and has little deformation. Therefore, compared with the prior art, the package structure of the present invention achieves a higher alignment accuracy.

Furthermore, the first insulating layer and the second insulating layer can be used for circuit protection without increasing the thickness of the overall package structure. As such, after the semiconductor element is disposed on the first insulating layer, the encapsulant encapsulating the semiconductor element has a thickness less than 200 μm. Therefore, the package structure has a reduced thickness and is applicable in thin electronic products.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:
    forming a first insulating layer on a carrier;
    forming a circuit layer on the carrier;
    forming a plurality of conductive posts on the circuit layer;
    after forming the plurality of conductive posts on the circuit layer, forming a dielectric body on the first insulating layer, wherein the dielectric body has a first surface coupled to the first insulating layer and a second surface opposite to the first surface, and the circuit layer and the plurality of conductive posts formed on the circuit layer are embedded in the dielectric body;
    forming a second insulating layer on the second surface of the dielectric body, wherein a glass transition temperature of the first insulating layer and/or the second insulating layer is greater than 250° C.;
    removing the carrier;
    after removing the carrier, disposing a semiconductor element on the first insulating layer, wherein the semiconductor element is electrically connected to the circuit layer; and
    forming an encapsulant on the first insulating layer to encapsulate the semiconductor element, wherein the encapsulant has a thickness between 20 and 180 μm.

2. The method of claim 1, wherein the conductive posts are exposed from the second surface of the dielectric body.

3. The method of claim 2, further comprising forming in the first insulating layer a plurality of first openings for exposing the circuit layer, and forming in the second insulating layer a plurality of second openings for exposing the conductive posts.

4. The method of claim 3, further comprising forming a plurality of conductive bumps on the circuit layer exposed from the first openings of the first insulating layer.

5. The method of claim 4, wherein the conductive bumps are 50 μm in height.

6. The method of claim 1, wherein a thickness of the first insulating layer or the second insulating layer is between 1 and 20 μm.

7. The method of claim 1, wherein the glass transition temperature of the first insulating layer and/or the second insulating layer is greater than 400° C.

8. The method of claim 1, wherein the first insulating layer and/or the second insulating layer are made of polyimide (PI), polyamide-imide (PAI) or polybenzimidazole (PBI).

\* \* \* \* \*